(12) United States Patent
Kanesashi

(10) Patent No.: US 6,872,083 B2
(45) Date of Patent: Mar. 29, 2005

(54) SOCKET FOR ELECTRICAL PARTS

(75) Inventor: Hokuto Kanesashi, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 45 days.

(21) Appl. No.: 10/305,118

(22) Filed: Nov. 27, 2002

(65) Prior Publication Data

US 2003/0104712 A1 Jun. 5, 2003

(30) Foreign Application Priority Data

Nov. 30, 2001 (JP) .......................................... 2001-366444

(51) Int. Cl.[7] .............................................. H01R 12/00
(52) U.S. Cl. ........................ 439/73; 439/525; 439/330; 439/264
(58) Field of Search ...................... 439/68–73, 525–526, 439/264, 330

(56) References Cited

U.S. PATENT DOCUMENTS

| | | | | |
|---|---|---|---|---|
| 4,969,828 A | * | 11/1990 | Bright et al. ................. | 439/68 |
| 5,395,255 A | * | 3/1995 | Kato ............................ | 439/72 |
| 5,647,750 A | * | 7/1997 | Tran et al. .................... | 439/72 |
| 5,653,599 A | * | 8/1997 | Stratas ......................... | 439/73 |
| 5,730,620 A | * | 3/1998 | Chan et al. .................. | 439/526 |
| 5,793,618 A | * | 8/1998 | Chan et al. .................. | 361/809 |
| 5,807,104 A | * | 9/1998 | Ikeya et al. ................... | 439/73 |

* cited by examiner

*Primary Examiner*—Truc T. T. Nguyen
(74) *Attorney, Agent, or Firm*—Staas & Halsey LLP

(57) ABSTRACT

The IC socket for electrical parts comprises a base plate, a tab film on the base plate on which an IC package is mounted and a pressing jig on the tab film for pressing the IC package toward the tab film. The tab film comprises an electrode pattern to be electrically connected with the IC package and a plate-like connecting electrode to be electrically connected with the base plate. To the base plate, contact pins are arranged. An upper end contact portion of the contact pin is protruded from an upper surface of the base plate for abutting on the connecting electrode. The pressing jig, tab film and base plate are detachably fixed by a bolt and nut and in this state the tab film is pressed by the pressing jig body so that the connecting electrode of the tab film elastically abuts on the upper end contact portion of the contact pin.

20 Claims, 10 Drawing Sheets

PRIOR ART

PRIOR ART

SOCKET FOR ELECTRICAL PARTS

BACKGROUND OF THE INVENTION

1. Field of the Invention

The present invention relates to an IC socket for detachably accommodating and holding an electrical part such as an IC package and for electrically connecting the IC package to a printed circuit board.

2. Prior Art

In a known art, for example, as shown in FIG. 10 to FIG. 12, an IC socket of this kind is disclosed in Japanese laid-open patent 242977/1999.

As shown in FIG. 10, the IC socket 11 in the known art is structured to be mounted on a printed circuit board 12 and an IC package 13 is mounted and held on the IC socket 11, thereby the IC package 13 is electrically connected to the printed circuit board 12.

The IC socket 11 has a base plate 14, a tab film 15, a ball guide 16 and a pressing jig 17, in this order from bottom to top, and these members are structured to be detachably fixed together by a bolt 18 and a nut 19.

The base plate 14, as shown in FIG. 10, is formed to have a plate like quadrangular shape and has a peripheral portions at four side portions of the base plate 14. A plurality of round pins 14a is disposed at the four sides peripheral portions in two rows. At an inner side of the rows of the round pins, a total of 4 bolt holes 14b and positioning holes 14c are formed. An elastic member 14d made from a silicone rubber is disposed at a center portion of the base plate 14. As shown in FIGS. 10 and 11, the round pin 14a is arranged to penetrate vertically through the base plate 14 and has a concave fitting portion 14e at its upper portion and an inserting portion 14f at its lower portion protruding downward from a lower surface of the base plate 14. The inserting portion 14f is designed to insert into a through hole 12a of the printed circuit board 12 to establish electrical connection between the round pin 14a and the printed circuit board 12.

The tab film 15, as shown in FIGS. 10 and 11, is formed to be a thin sheet-like quadrangular shape having an approximately same 4 sides dimension as that of the base plate 14. An electrode pattern 15a is provided on an upper surface, opposite to the IC package 13, of the tab film 15, to establish an electrical connection with an array of terminals 13a of the IC package 13.

On a lower (rear) surface, which is opposite to the base plate 14, of the tab film 15, a pin type terminal 15b, which is designed to connect to the base plate 14, is provided. And a conductor is provided to the tab film 15 for electrically connecting the pin type terminal 15b and the electrode pattern 15a.

In addition, the pin type terminal 15b is structured to be able to insert into the concave fitting portion 14e of the round pin 14a of the base plate 14. Furthermore, the tab film 15 has also a bolt hole 15c and a positioning hole 15d having the same dimensions as that of holes 14b and 14c of the base plate at the place corresponding to the bolt hole 14b and the positioning hole 14c of the base plate 14.

Still more, as shown in FIGS. 10 to 12, the ball guide 16 is made from an electrically insulating material and has a quadrangular shape having an approximately same dimension as that of a pressing jig body 20 of the pressing jig 17. At a central portion of the ball guide, an opening 16a for positioning a periphery of the array of the solder balls 13a of the IC package 13 is formed. And a bolt hole 15c and a positioning hole 15d of the tab film 15 are provided and a bolt hole 16b and a positioning hole 16c whose position and the size are corresponding to the bolt hole 15c and the positioning hole 15d are formed to the ball guide.

As shown in FIG. 12, the solder balls 13a disposed at an outermost periphery of the IC package 13 is positioned by the opening 16a.

Still further, as shown in FIG. 11, the pressing jig 17 is mainly comprised of a pressing jig body 20 having a frame like quadrangular shape, and a cover member 21 attached rotatably to the pressing jig body 20 with an axis 22 and urged by a spring 29 in an opening direction of the cover member 21 (clockwise direction in FIG. 11). A pusher member 23 for pushing the IC package 13 is swingingly (oscillatingly, rockingly) attached to the cover member 21 by an axis 30 and urged by a spring 28 toward a direction away from the cover member 21 (downward direction in FIG. 11). Still further, the cover member 21 is provided with an engaging portion 24, and the pressing jig body is provided rotatably with a latch member 25 by an axis 26. The engaging portion 24 can be engaged with the latch member 25 which is urged by a spring 27 in a clockwise direction as shown in FIG. 12 (in an engaging direction).

As shown in FIGS. 11 and 12, the pressing jig body 20, inside of which the quadrangular IC package 13 is inserted, is structured to be mounted on the tab film 15 and has positioning pins 20a, which are fitted into positioning holes 14c, 15d and 16c, is protruded downward from a lower surface portion of the pressing jig body 20. Further, as shown in FIG. 10, the pressing jig body 20 is provided with bolt holes 20b whose locations and dimensions are each corresponding to each of the bolt holes 16b of the ball guide 16.

As shown in FIG. 11, each of the positioning pins 20a is fitted into each of the positioning holes 14c, 15d, 16c of the base plate 14, tab film 15 and ball guide 16, respectively, thereby each member is positioned and assembled in a predetermined positional relationship. And finally the bolts 18 are each inserted, from upper side, into each bolt holes 14b, 15c, 16b, 20b of the foregoing base plate 14, tab film 15, ball guide 16 and pressing jig body 20 respectively, and then the nuts 19 are attached and screwed up to fix these members as overlapped.

In the IC socket of this kind, as shown in FIG. 12, an outer peripheral edge of the IC package 13 is guided and positioned by an inner surface of the quadrangular frame-like pressing jig body 20 and the solder balls 13a of the IC package 13 are also structured to be positioned by the ball guide 16.

The thus positioned IC package 13 is pressed at its peripheral portion of the upper surface by the pusher member 23, as shown in FIG. 11.

However, in such conventional IC package as mentioned above, since the pin type terminals 15b of the tab film 15 are structured to be fitted into the concave fitting portion 14e of the round pin 14a of the base plate 14, it is difficult to produce the round pin 14a having the concave fitting portion 14e and also difficult to attach and detach the pin type terminals 15b into and from the concave fitting portion 14e. Further, in the conventional IC package, since there is a need to fit the round pins 15b into the concave fitting portion 14e, it is necessary to make the diameter of the round pins 14a large, being inconvenient in reducing an arrangement pitch (distance between the neighboring contact pins) of the contact pins and hence in downsizing the whole size of the IC socket.

SUMMARY OF THE INVENTION

An object of the present invention is to provide an IC socket having a tab film (intermediate connector) which can be easily produced using a simple process and easily attached and detached to a base plate, to thereby achieve the downsizing of the whole size of the IC socket.

This and other objects can be achieved by providing IC sockets for an electrical part comprising:

a base;

a connecting member attached to the base and capable of electrically connecting to a printed circuit board;

an intermediate connector provided on the base for electrically connecting the connecting member and a terminal of the electrical part;

the intermediate connector comprising:

an electrode pattern, which electrically connects to the terminals of the electrical part, formed on a portion of one surface of the intermediate connector, the electrical part being mounted on the one surface;

a connecting electrode, which electrically connects to the connecting member, formed on a place of another surface of the intermediate connector, the another surface being placed face to face with the connecting member; and a conductor electrically connecting the electrode pattern and the connecting electrode;

pressing means, mounted on the intermediate connector, comprising a body having an opening portion at a central portion of the body through which the electrical part is inserted; and fixing means for detachably fixing the base, the intermediate connector and the body together, wherein the connecting electrode and the connecting member elastically abut with each other at the time the base, the intermediate connector and the body are fixed together by the fixing means.

According to this structure, since conventional fitting operation such as inserting pin type terminals into the concave fitting portion of the round pin can be eliminated, attaching and detaching operations can be carried out smoothly. In addition, since there is no need to form the conventional round pin (or connecting member) having large diameter and the concave fitting portion, the connecting member of the present invention can be produced easily, so that the IC socket can be made narrower in pitch of the contact pin array and hence downsizing of the whole size of the IC socket can be realized.

Furthermore, since the body of the pressing member, which supports a cover member rotatably, is structured to press the intermediate connector, so that contact pressure between the connecting electrode of the intermediate connector and an upper end portion of the connecting member can be secured without providing an additional pressing member.

A second aspect of the present invention is characterized in that in addition to the foregoing aspect, the intermediate connector is formed to have a flexible sheet and the upper end portion of the connecting member is designed to protrude from an upper surface of the base, the IC socket further comprises an elastic member disposed between the body and the portion of the one surface of the intermediate connector, wherein the elastic member is elastically deformed so that the connecting electrode and the connecting member are pressed with each other to establish an elastic contact therebetween.

According to this structure, even if a dimensional error arises in forming or assembling, approximately the same contact pressure can be achieved in each contact portion between the connecting electrode and the contact pin (connecting member), being advantageous from a practical standpoint.

The nature and further characteristic features of the present invention will be made more clear from the descriptions made with reference to the accompanying drawings.

DESCRIPTION OF THE PREFERRED EMBODIMENT

Figure 1:
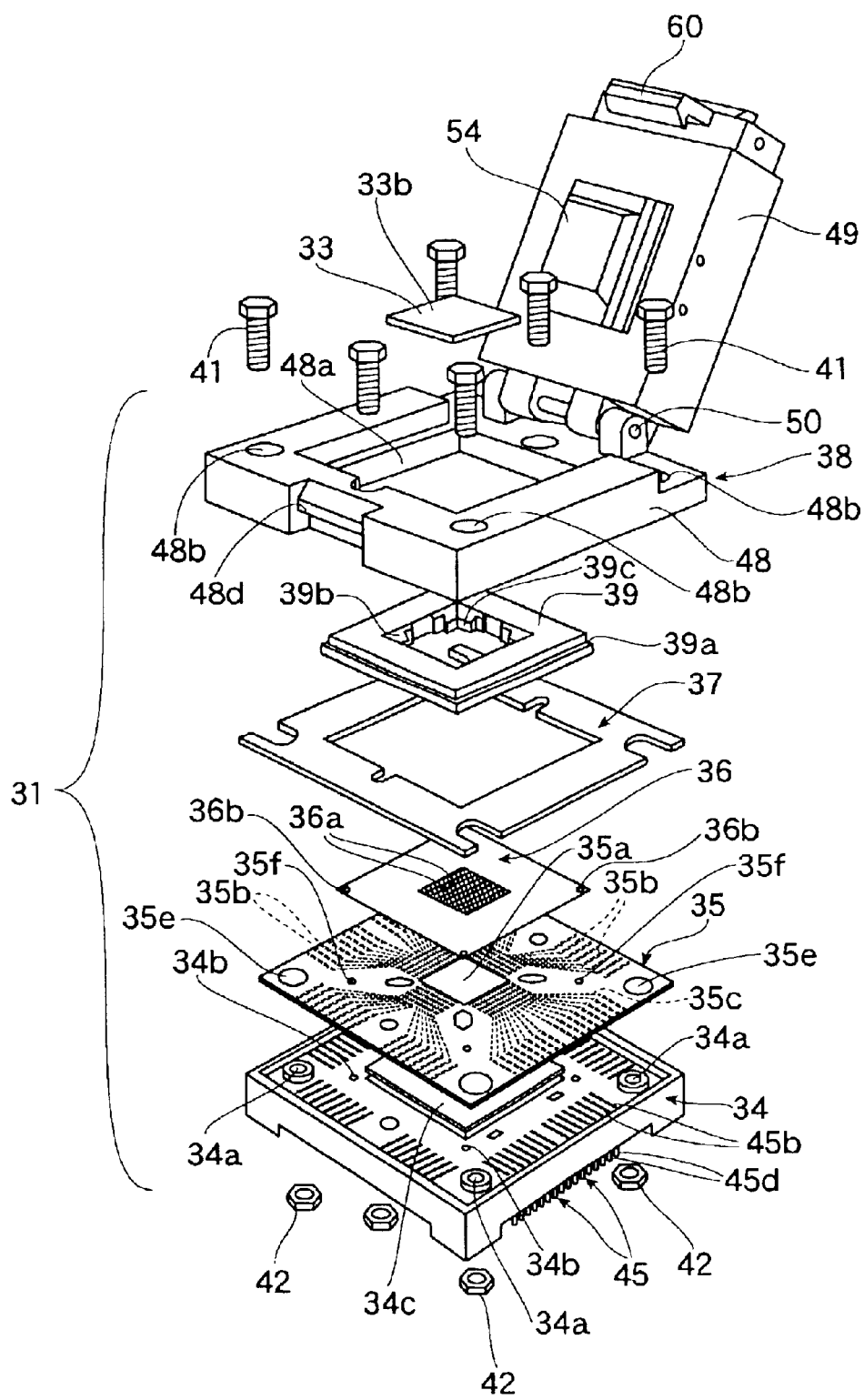
FIG. 1 is an exploded perspective view of an IC socket for an electrical part according to one embodiment of the present invention.

The preferred embodiment of the present invention will be more precisely described hereinafter by referring to the accompanying drawings.

FIG. 1 to FIG. 9B show an embodiment of the present invention.

Referring first to a configuration of an IC socket according to the embodiment, reference numeral 31 in the drawings represents an IC socket. For carrying out a performance test of an IC package 33, the IC socket 31 is designed to be disposed on a printed circuit board (not shown) and It is to be noted that term such as "upper (upward)", "lower (downward)", and the like are used herein with reference to the illustration of figures or in a general usable state of the socket.

Figure 9A:
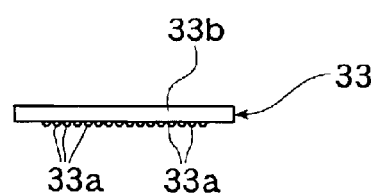
FIG. 9A is a front view of an IC package.
Figure 9B:
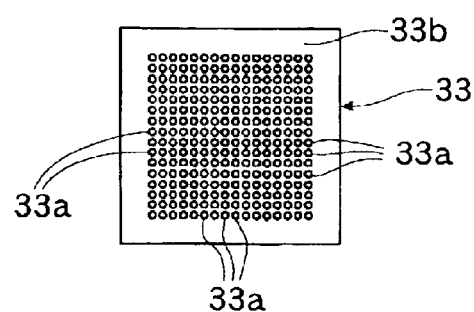
FIG. 9B is a bottom plan view of the IC package of FIG. 9A.
Figure 10:
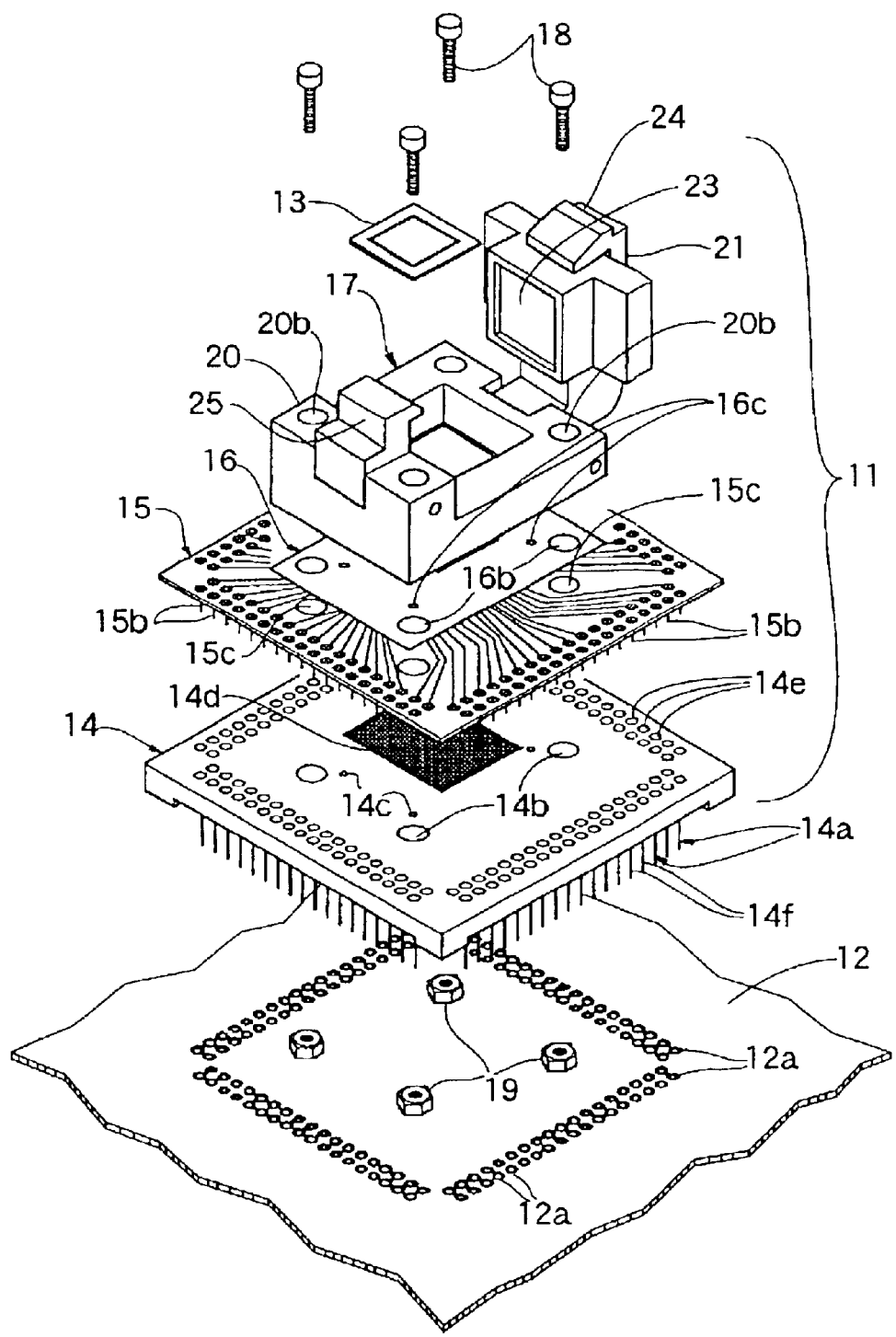
FIG. 10 is an exploded perspective view showing a conventional IC socket.

As shown in FIGS. 9A and 9B, this IC package 33 is a package what is called a BGA type (Ball Grid Array). That is, the IC package 33 is provided with a package body 33b having a substantially quadrangular shape, on a lower surface of which a plurality of approximately round shaped solder balls 33a are arranged to be shaped as a matrix (grid array) having vertical rows and transverse rows of the solder balls 33a.

The IC socket 31, as shown in FIG. 1 etc, comprising a base plate (base) 34, a tab film 35 as an "intermediate connector", and an alignment plate 39. These members or elements are structured to be detachably fixed to combine together into one body by a "fixing means" such as a bolt 41 and a nut 42.

Figure 3:
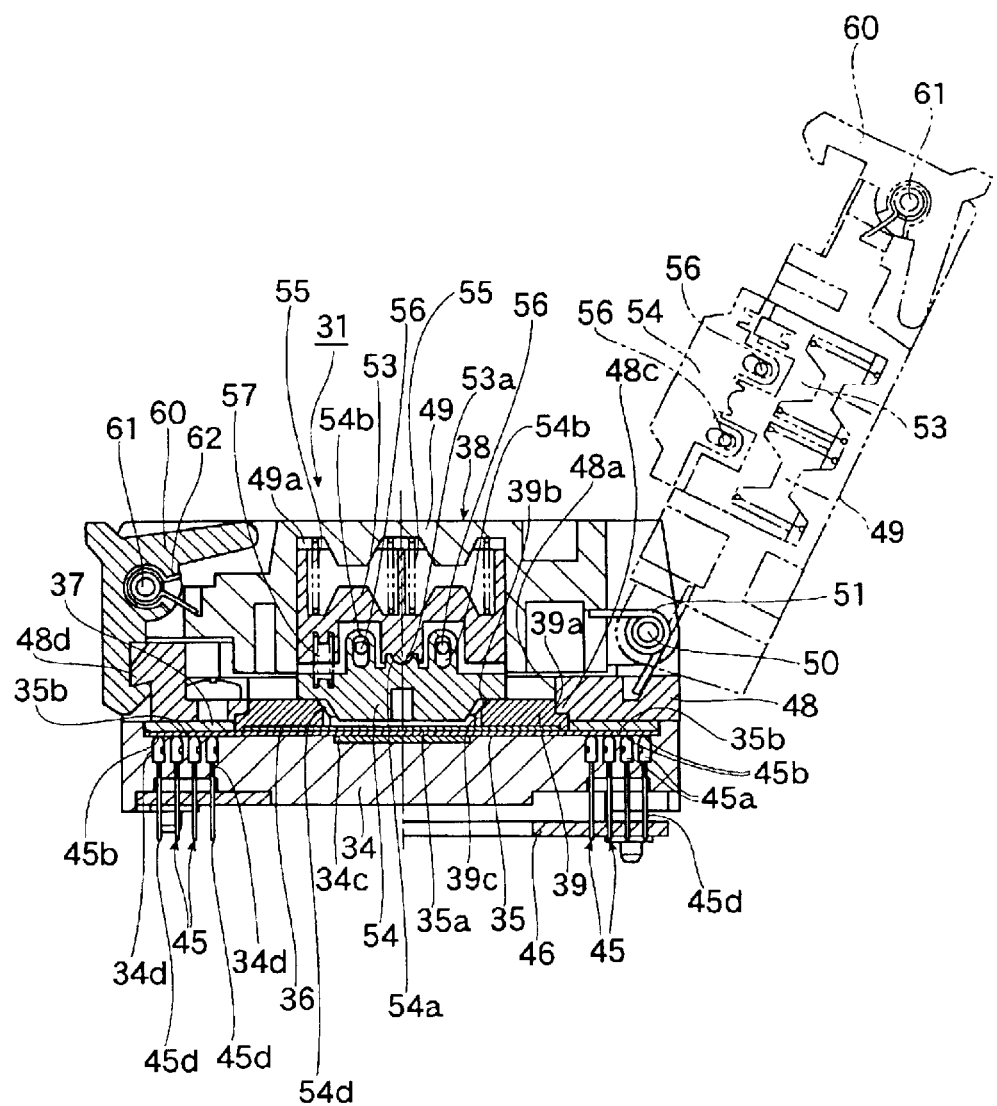
FIG. 3 is a sectional view of the IC socket of FIG. 1.

The base plate 34, as shown in FIGS. 1 and 3, is shaped to be a quadrangular plate, at four sides of the peripheral portion of which a plurality of contact pins (connecting member) 45 are arranged in rows of four. The base plate 34 has a plurality of bolt holes 34a and positional holes 34b, and further has, at a central portion thereof, a quadrangular shape elastic member having elasticity made from silicone rubber.

Figure 6:
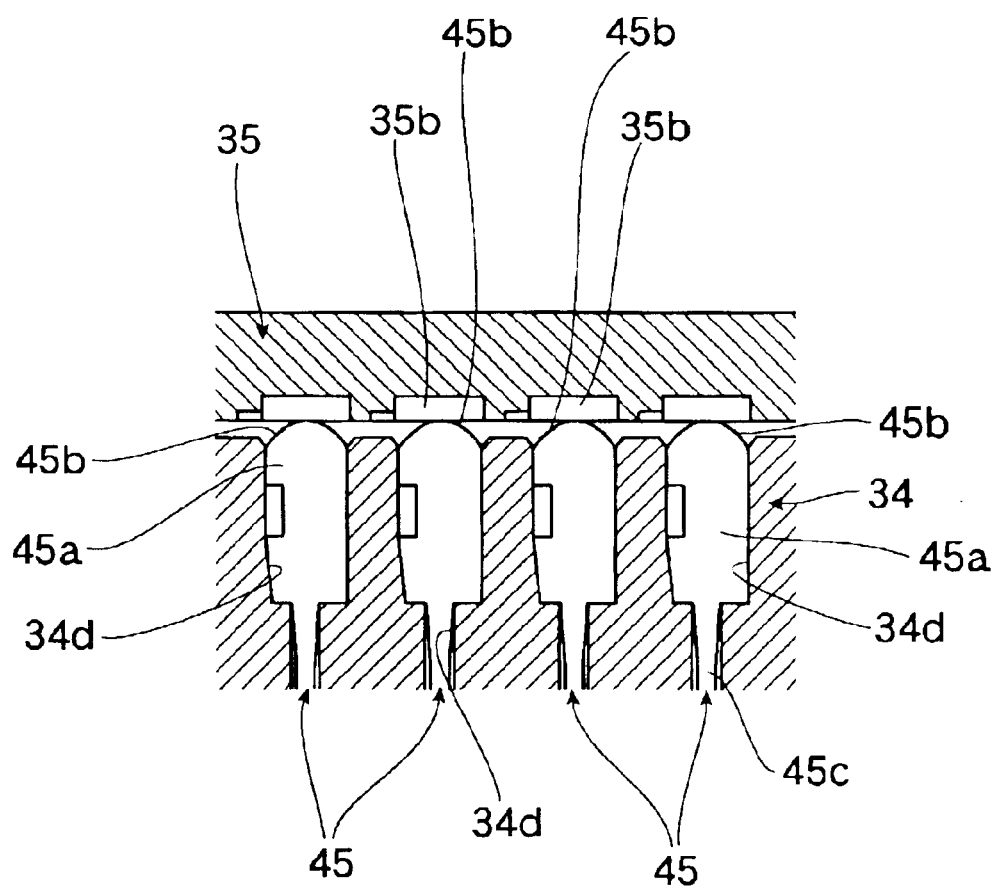
FIG. 6 is an enlarged sectional view showing a contact state between a connecting electrode and a contact pin of the IC socket of FIG. 1.
Figure 7:
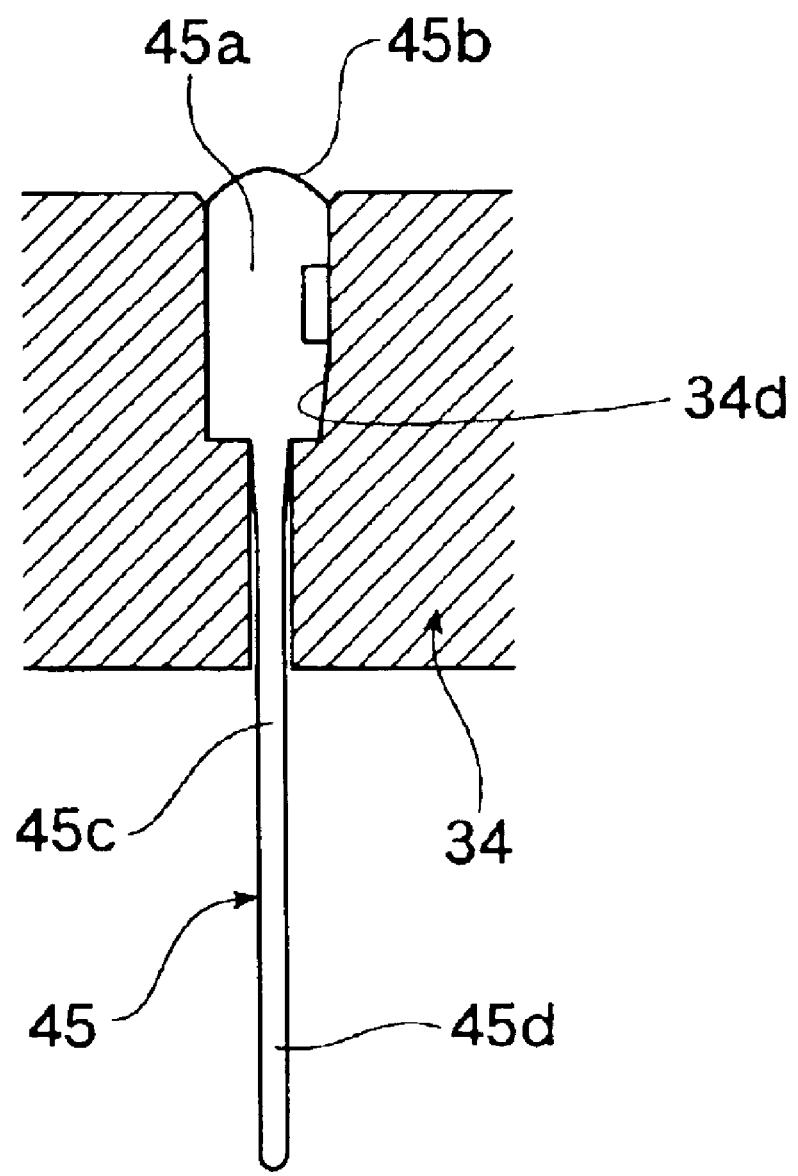
FIG. 7 is a front view showing a contact pin of the IC socket of FIG. 1.

The contact pin 45 is made of an electrically conductive metal plate through press working to form an elongated plate as shown in FIG. 7. That is, an upper portion 45a of the contact pin 45 is formed to be widened and the upper portion 45a is pressed to be inserted into a through hole 34d of the base plate 34. At an upper end edge portion of the upper portion 45a as an end edge portion of the contact pin 45, an upper end contact portion 45b is formed so as to establish contact between the upper contact portion 45b and the tab film 35. The upper end contact portion 45b, as shown in FIGS. 6 and 7, is formed to have a protruded round shape (R shape) so as to protrude from an upper surface of the base plate 34. Further, a lower portion 45c, which is positioned lower than the widened upper portion 45a of the contact pin, is formed to be narrower in width than the width of the upper portion 45a and inserted into a through hole 34d of the base plate 34 so as to protrude downward from a lower surface of the base plate 34. A lead portion 45d, which is the downwardly protruded portion, as shown in FIG. 3, is inserted through a locate board 46 and inserted into a through hole of the printed circuit board (not shown), to establish an electrical contact with the printed circuit board.

Figure 5:
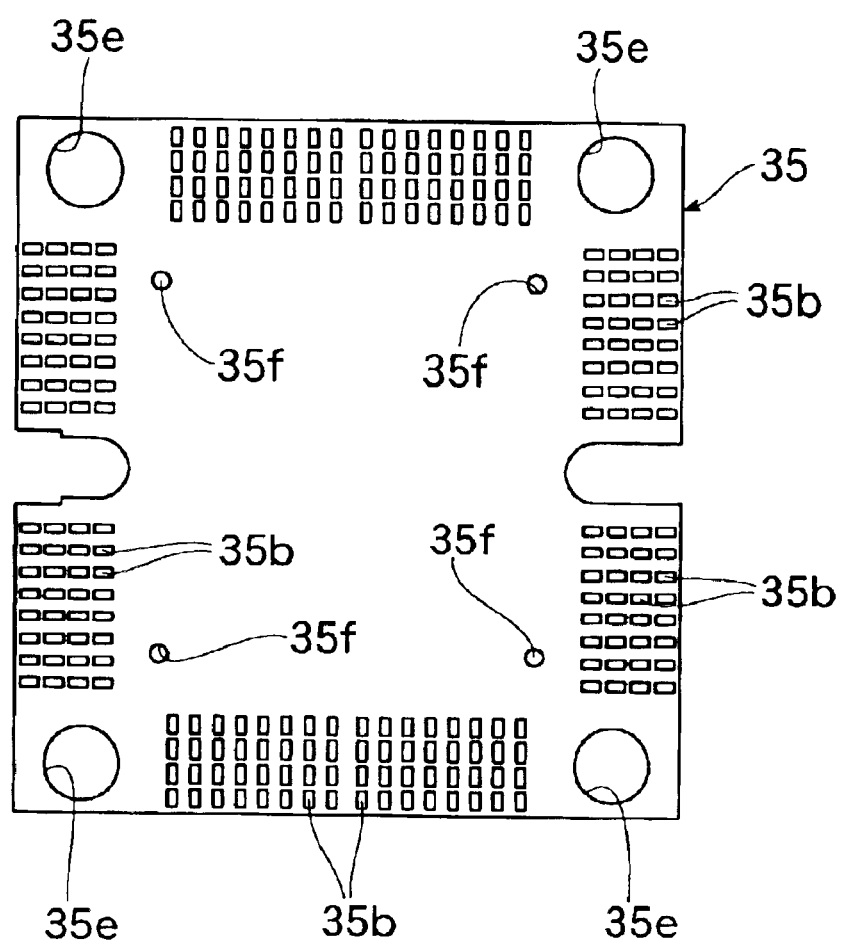
FIG. 5 is a bottom plan view of a tab film of the IC socket of FIG. 1.

The tab film 35 is formed to be a thin sheet (film) having quadrangular shape whose dimension is approximately same dimension of the base plate 34. An upper surface of the tab film is formed to be an accommodation surface to accommodate the IC package 33. The tab film 35, as shown in FIG. 1, has an electrode pattern 35a at a central portion of one surface (front surface) thereof so as to establish electrical contact between the electrode pattern 35a and the array of the solder balls 33a of the IC package 33. The tab film 35, as shown in FIG. 5, also has a connecting electrode 35b at a peripheral portion of another surface (rear surface) thereof on the base plate 34 side so as to establish electrical contact between the connecting electrode 35b and the contact pin 45. The tab film 35 also has a conductor 35c to electrically connect between the connecting electrode 35b and the electrode pattern 35a.

The connecting electrodes 35b each have such a shape as an elongated plate, as shown in FIG. 5, and are arranged in a manner of rows corresponding to the arrangement of the contact pins. The conductors 35c are each extended from each of connecting electrodes 35b to the electrode pattern 35a so as to establish electrical contact therebetween. And the connecting electrodes 35b are structured to establish electrical contact to the contact pin 45 by abutting a central portion of the round shaped (R shape) upper end contact portion 45b of the contact pins 45 on the connecting electrodes 35b (refer to FIG. 6).

The tab film 35 also has a bolt hole 35e and a positioning hole 35f having approximately the same diameter of the holes of the base plate 34 at a place corresponding to the bolt and the positioning holes of the base plate 34 (refer to FIG. 1).

Figure 8:
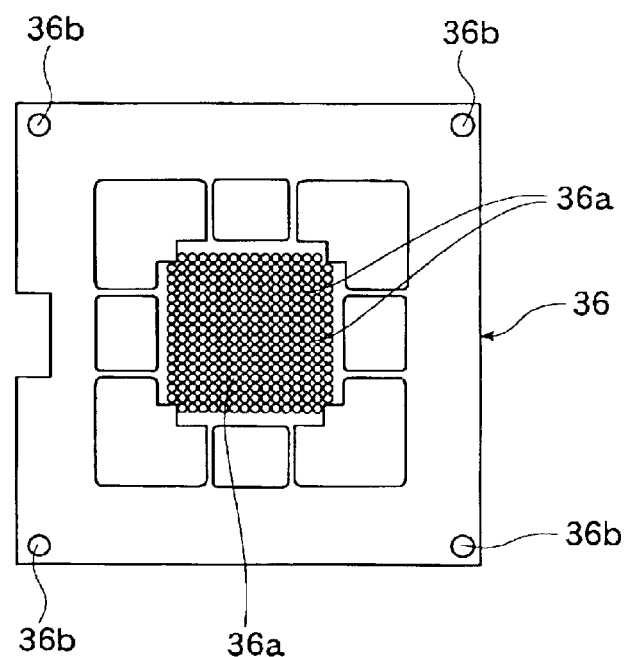
FIG. 8 is a plan view showing a stopper of the IC socket of FIG. 1.

The IC socket can further have a stopper 36. The stopper 36 is formed to be a quadrangular shape sheet made from polyimide resin having heat resistance, insulating property and a prescribed hardness, as shown in FIG. 8. A plurality of openings 36a for the solder ball, into each of which a plurality of solder balls 33a is each inserted, are formed at a central portion of the stopper 36.

Figure 4:
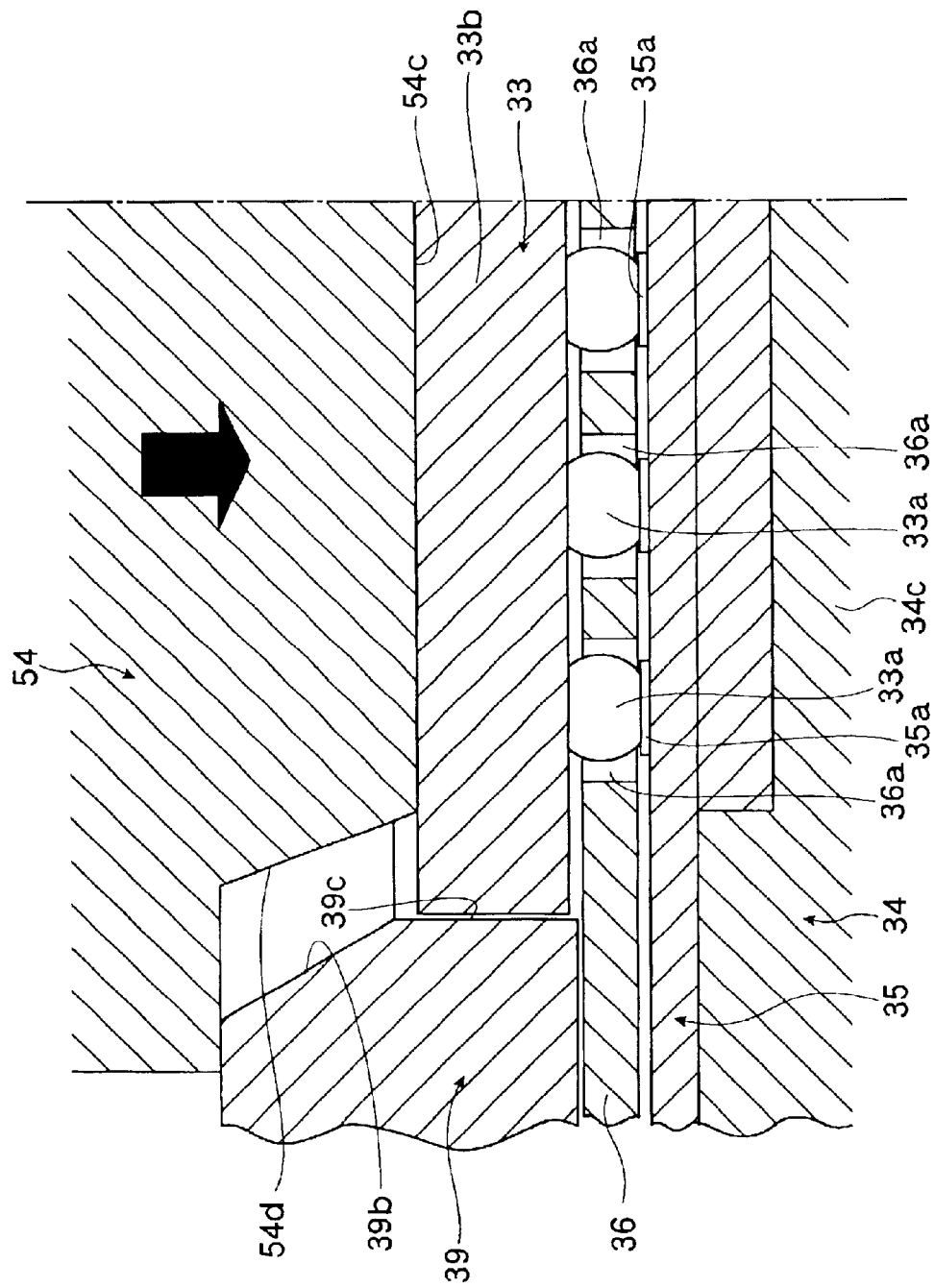
FIG. 4 is an enlarged sectional view of the IC socket of FIG. 1.

The stopper 36 has also a positioning hole 36b the diameter and location of which are corresponding to the positioning hole 35f of the tab film 35. This stopper 36, as shown in FIG. 4, is formed to have a thickness slightly thinner than the height of the solder ball 33a and disposed between a lower surface of the IC package body 33b and the upper surface (accommodating surface) of the tab film 35, to thereby prevent the solder ball 33a from being deformed beyond a prescribed thickness. The dimension of the opening 36a for the solder ball is designed to be somewhat larger than that of the solder ball 33a so that the solder ball 33a can be entered into the opening 36a, to thereby secure the positioning of the side portion of the solder ball 33a, even if dimensional errors occur during forming processes.

The IC socket can further have an elastic member 37. The elastic member 37 is made from silicone rubber and has a shape of a quadrangular frame, as shown in FIGS. 1 and 3. The elastic member 37 is placed between a surface portion of the tab film 35, on which the connecting electrode 35b of the tab film 35 is arranged, and a pressing jig body 48, which will be precisely described later, in a manner that the elastic member 37 is elastically deformed vertically (in a direction of its thickness) within a prescribed amount.

Figure 2:
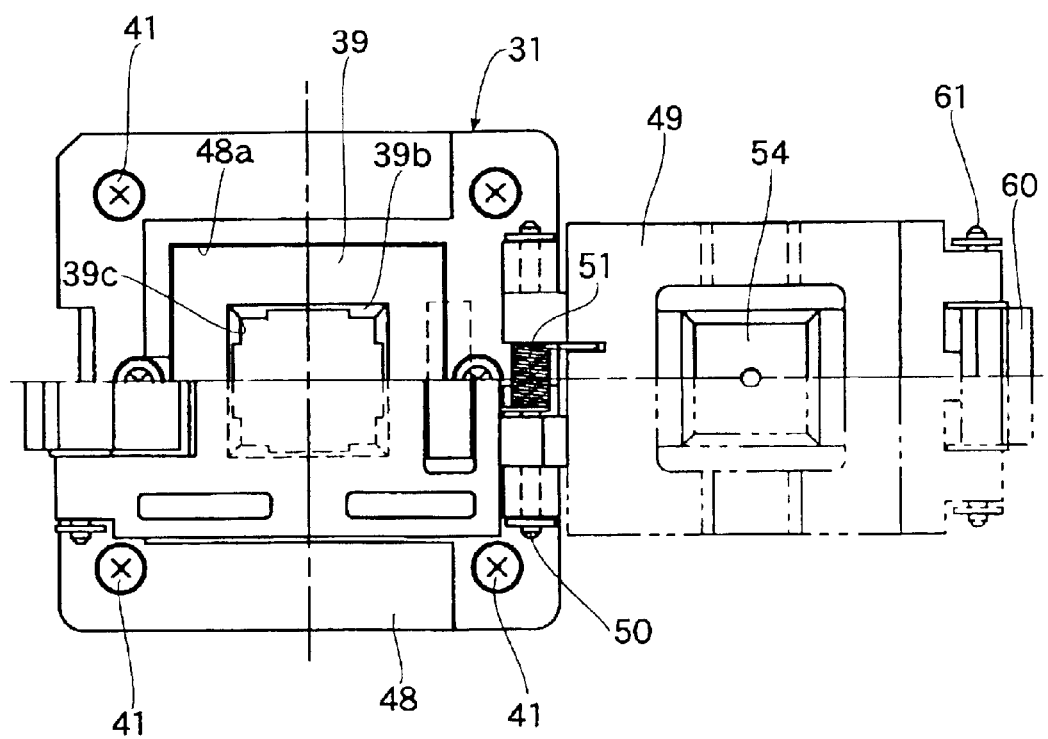
FIG. 2 is a plan view of the IC socket of FIG. 1.

The IC socket further has a pressing jig 38. The pressing jig 38 comprises a pressing jig body 48 (body) having a quadrangular frame, as shown in FIGS. 1 and 3 etc. To the pressing jig body 48, a cover member 49 is rotatably attached with an axis 50. The cover member is urged by a spring 51 in an opening direction (clockwise rotational direction in FIG. 3). The pressing jig body 48 also provided with, as shown in FIG. 1 to FIG. 3, an inner opening 48a in the inside of the frame and a plurality of bolt holes 48b into each of which the bolt 41 is inserted.

In the inner opening 48a, an alignment plate 39 is detachably disposed. This alignment plate 39 has a frame-like shape, as shown in FIGS. 1 and 2, and is structured to accommodate the IC package 33 in an inside of the opening portion thereof so as to position an outer peripheral surface of the IC package body 33b, as shown in FIG. 4.

More specifically, this alignment plate 39, as shown in FIGS. 1 and 3, has a step portion 39a formed at an outer peripheral portion thereof. The step portion 39a is structured to be engaged with an inner peripheral portion 48c located at an under portion of the pressing jig body 48 so as to detachably attached to the pressing jig body 48.

Further, at an upper side of inner peripheral portion of the frame-like alignment plate 39, a tapered guide surface 39b is formed for guiding the IC package 33. The alignment plate 39 also has a positioning surface 39c for positioning and accommodating the guided IC package 33 guided by the guide surface 39b at a prescribed position. The positioning surface 39c is formed in a vertical direction continuously downward from the guide surface 39b.

To the cover member 49, as shown in FIG. 3, a pusher 53 and a pad 54 as a "pressing member" are arranged for pressing the IC package 33. The pusher 53 having a spherical convex portion 53a at its central portion of a lower surface of the pusher 53 is arranged vertically movably at a hollow portion 49a of the cover member 49 and urged downward by a plurality of spring 55, as shown in FIG. 3.

To this pad 54, a spherical recess 54a which is structured to abut on the spherical convex portion 53a and vertically elongated ellipsoidal holes 54b disposed on both sides of the concave portion 54a are formed. Into these ellipsoidal holes 54b, two axes 56 held by the cover member 49 are inserted so as for the pad 54 to be supported by the cover member 49, in a manner that the pad 54 can be swinging (or rocking) around a center of the abutting portion of the convex portion 53a of the pusher 53. The axes 56 are detachably held by the cover member 49 so as for the pad 54 to be replaced with another pad by removing the axes 56. At a lower end portion of the pad 54, a pressing surface 54c having an approximately same dimension of the upper surface of the IC package 33 is formed.

This pressing surface 54c, as shown in FIG. 4, is formed to have a surface the size of which is smaller than the size of the inner side opening of the alignment plate 39 (the size of the opening is marked out by the quadrangular shape positioning surface 39c). And a tapered surface 54d approximately parallel to the guide surface 39b of the alignment plate 39 is formed continuously upward from the pressing surface 54c.

Furthermore, as shown in FIG. 3, a spring 57 is arranged at a portion apart from an axis 50 (right side in FIG. 3) and between the pad 54 and the pusher 53. This spring 57 urges the pad 54 in an anticlockwise rotational direction in FIG. 3 with respect to the pusher 53.

Furthermore, to the pressing jig body 48, as shown in FIG. 3, an engaging portion 48d is formed. And to the cover member 49, a latch member 60 to be engaged with the engaging portion 48d is rotatably arranged by an axis 61.

This latch member 60 is urged toward anticlockwise direction (toward an engaging direction) in FIG. 3 by a spring 62.

A positioning pin (not shown) formed to the alignment plate 39 and protruded downward is inserted into each positioning hole 34b, 35f and 36b of the base plate 34, tab film 35 and stopper 36 so that each members 34, 35 and 36 are assembled in a predetermined positional relationship. And the bolt 41 is inserted from upward into each bolt hole 34a, 35e and 48b of the base plate 34, tab film 35 and pressing jig body 48 respectively and then the nut 42 is screwed into the bolt 41 to screw up to fasten them in an overlapped state.

An elastic member 34c disposed at a central portion of the base plate 34 is disposed at a region corresponding to a pressed region of the tab film 35 on which the solder ball 33a array of the IC package is pressed.

In the IC socket 31 assembled and disposed on the printed circuit board, the IC package 33 is accommodated as follows.

That is, with the cover member 49 of the pressing jig 38 being opened, the IC package 33 is inserted into the pressing jig body 48 and mounted on the tab film 35. That is, at first, the peripheral portion of the package body 33b of the IC package 33 is guided along the guide surface 39b of the alignment plate 39 and then positioned to a prescribed place by the positioning surface 39c.

In addition, as shown in FIG. 9, each solder ball 33a is inserted into each solder ball opening 36a so that a side surface portion of each solder ball is guided and positioned by an inner peripheral surface of each solder ball opening 36a. As mentioned above, since the solder ball 33a is guided and positioned by the stopper 36, accuracy of the positioning of the solder ball 33a in relation to the electrode pattern 35a of the tab film 35 can be further improved in cooperation with the positioning by the alignment plate 39.

Under this condition, each solder ball 33a of the IC package 33 is brought into contact with the electrode pattern 35a of the tab film 35.

Next, the cover member 49 of the pressing jig 38 is then closed so as to engage the engaging portion 48d of the pressing jig body 48 with the latch member 60 of the cover member 49, to complete the closing of the cover member 49. With this operation, the upper surface of the package body 33b of the IC package 33 is pressed by the pressing surface 54c of the pad 54, thereby the elastic member 34c is elastically deformed. The electrode pattern 35a of the tab film 35 is urged toward the solder ball 33a of the IC package 33 by the resulting reaction force of the deformed elastic member 34c, resulting in establishing an electrical contact, in a pressurized manner, between the electrode pattern 35a and the solder ball 33a.

In a case where a plurality of solder balls 33a of the IC package 33 is arranged in a narrower pitch, a high degree of precision is required in producing the circuit pattern of the printed board especially when the solder balls 33 is designed to directly contact to the printed circuit board, increasing in cost of the printed board or being unable to produce it at worst. In the present invention, the conductor 35c is extended from the electrode pattern 35a provided at the central portion of the tab film 35 to a peripheral portion of the tab film 35 and the connecting electrodes 35b are provided at the peripheral portion of the tab film 35, so that a pitch (distance between neighboring electrodes) of the connecting electrodes 35b arrangement can be made wider than the pitch of the electrode pattern 35a.

Therefore, the pitch of the contact pins 45 arrangement of the base plate 34 and hence the pitch between each through hole of the printed circuit board can be widened to a desired pitch, being convenient in producing etc. of the printed board.

According to the IC socket 31 of the present invention, since the plate-like connecting electrode 35b is provided on the lower surface of the tab film 35 and the connecting electrode 35b is pressed to contact with the upper end contact portion 45b of the contact pin 45, which is provided to the base plate 34, by the reactive force (elastic force) of the elastically deformed elastic member 37 which is pressed to be deformed by the pressing body 48. Therefore, there is no need to use a conventional round pin 14a or a pin type terminal 15b (see FIGS. 11 to 12). Hence the pitch of the contact pins 45 arrangement can be made narrower and the size of the IC socket can also be made smaller.

When compared with the conventional pin type terminal 15b provided at the peripheral portion of the tab film 15, the plane-like connecting electrode 35b of this embodiment, which is provided on the lower surface of the tab film 35, can be produced at lower cost. Furthermore, electrical contact between the connecting electrode 35b and the upper end contact portion 45b of the contact pin can be established by merely abutting with each other without fitting the conventional round pin 14a into the pin type terminal 15b as seen in the conventional art. And still more, since the pressing jig 38, the tab film 35 and the base plate 34 are detachably fixed with the bolt 41 and the nut 42, and the tab film 35 is merely sandwiched between the pressing jig 38 and the base plate 34, so that the tab film 35, which is susceptible to damage, can be safely replaced by removing the bolt 41 and nut 42.

In addition, electrical contact between the connecting electrode 35b of the tab film 35 and the upper side contact portion 45b of the contact pin 45 can be surely maintained because these two are in pressed contact under reactive force (elastic force) generated by the deformed elastic member 37 arranged between the base plate 34 and the pressing jig body 48.

Even if there are dimensional differences between components or elements such as the base plates, the contact pins etc., the dimensional differences can be absorbed in the elastic deformation of the elastic member 37, so that the contact pressure between the connecting electrode 35b and the upper side contact portion 45b can be made approximately constant.

Further, the contact pressure between the connecting electrode 35b and the upper side contact portion 45b can be changed to a desired value by changing the thickness (height in the vertical direction in FIG. 3) of the elastic member 37.

In a case where the IC package 33 having different size is used, the different sized IC package can be accommodated by replacing the alignment plate 39 and the pad 54 with another ones having the size corresponding to the different sized IC package, so as to accommodate the different sized IC package.

A plurality of alignment plates 39 is previously prepared. The step portion 39a of the peripheral portion of all previously prepared alignment plate 39 have the same dimension (size and shape), so as to fit any of them into the same pressing jig body 48. The inner side opening of each of alignment plates has a different dimension in order to accommodate IC package having different size and shape. The size of the inner side opening is marked out by the guide surface 39b and the positioning surface 39c of the inner peripheral portion of the alignment plate 39. The alignment plate 39 is easily replaced with another one by removing the step portion 39a from the pressing jig body 48.

A plurality of pad 54 is also previously prepared. The concave portion 54a and the ellipsoidal holes 54b of the previously prepared pad 54 have the same dimensions and the same positional relationship, so as to be able to attach any of them to the same cover member 49. However, the dimension of the pressing surface 54c and the position of the tapered surface 54d are formed in concert with the size of the IC package 33 and the alignment plate 39. The pad 54 is easily replaced with another one by removing the two axes 56 from the cover member 49.

Figure 11:
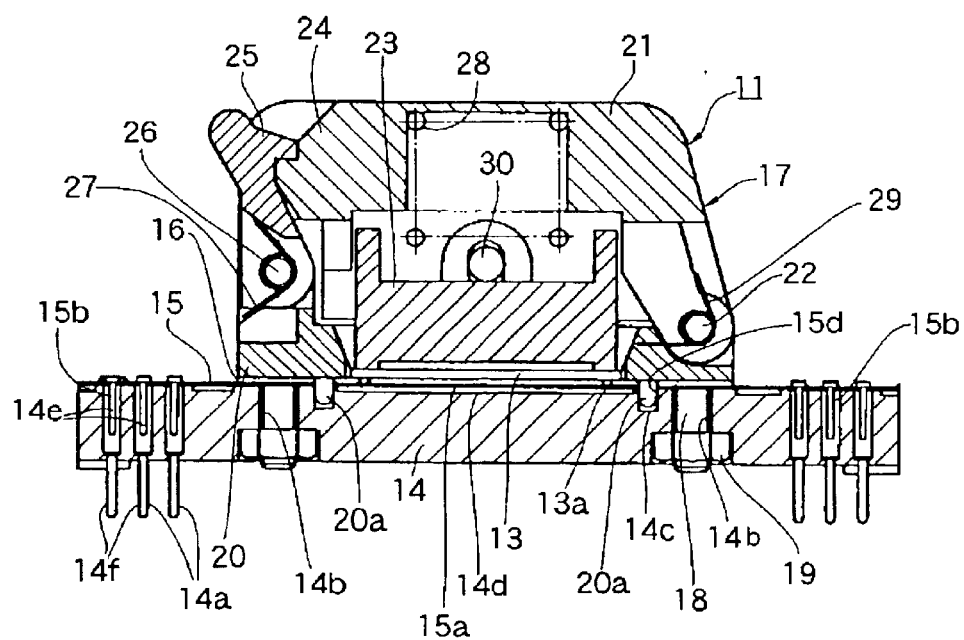
FIG. 11 is a sectional view of the conventional IC socket of FIG. 10.
Figure 12:
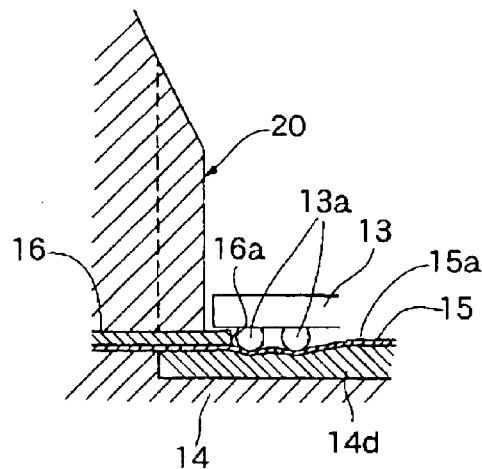
FIG. 12 is an enlarged sectional view showing a contact state between a solder ball of the IC package and a tab film of the conventional IC socket of FIG. 10.

According to the above-mentioned structure of the present invention, with only replacing the alignment plate 39 and the pad 54, the IC socket can be used for different IC packages having different dimensions, contrary to the conventional IC socket, shown in FIGS. 11 to 12, that the whole large set of pressing jig 38 must be replaced with another set of pressing jig 38 when different IC package is used.

To the alignment plate 39, the guide surface 39b is formed. Therefore, there is no need to guide the IC package 33 by using the pressing jig body 48 even when the size of the positioning surface 39c is considerably smaller than the size of the inner portion of the pressing jig body 48. Hence the IC package 33 can be surely guided to the positioning surface 39c along the guide surface 39b of the alignment plate 39.

Further, the IC socket of the present invention can be used for the IC package having different pitch or number of the solder ball 33a, by previously providing a plurality of different type of tab films 35 which correspond to the different IC packages.

In addition, the contact pin 45 is formed through press working from an electrically conductive metal plate so that, different from the conventional round pin 14a, forming of the contact pin 45 can be easily and less expensively carried out. The upper side contact portion 45b of the contact pin 45 is protruded to form a round shape (R shape) at its central portion, so that damage to the connecting electrode 35b of the tab film 35, which is designed to abut on the contact portion 45b, can be reduced because the contact portion 45b is not sharply protruded.

Further, the upper end of the contact portion 45b of the contact pin 45 is protruded to form a round shape (R shape) at its central portion, and the central portion (a portion) abuts on the connecting electrode 35b of the tab film 35 so that the pitch of the connecting electrodes 35b can be made narrower, being able to reduce the size of the IC socket 31. That is, in a case where the upper end of the contact portion 45b is not formed to have a round shape (R shape) and has a width approximately the same or wider than the width of the connecting electrode 35b, the upper end of the contact portion 45b may have a chance to contact a neighboring conductor 35c extended from other connecting electrode 35b, resulting in electrical short.

On the contrary, when the upper end contacting portion 45b is formed to be round shape (R shape) so as to establish contact between a portion of its central portion and the connecting electrode 35b, there is no fear of occurring electrical short by unintentional contact with a neighboring conductor 35c of the connecting electrode 35b. As the result of this, the pitch of the connecting electrode 35b can be made narrower, hence reducing the size of the IC socket 31. Incidentally, if the width of the upper portion 45a of the contact pin is made narrower in order to make an abutting area on the connecting electrode 35b smaller, the mechanical strength of the upper portion 45a of the contact pin becomes low, being disadvantageous.

In addition, as shown in FIG. 4, a sheet-like stopper 36 is interposed between the lower surface of the IC package body 33b and the tab film 35 in order to prevent the solder ball 33a from being excessively deformed or damaged when the IC package body 33b of the IC package 33 is pressed by the pad 54. The sheet-like stopper 36 is replaceable with another one having a different thickness so that various IC package having different size of the solder ball 33a can be used for the same socket.

Furthermore, the sheet-like stopper 36 is formed with a plurality of solder ball openings 36a into each of which each solder ball 33a is inserted, so as to surely prevent each solder ball 33a from being excessively deformed.

Still further, the stopper 36 can be made from polyimide resin which can be processed precisely using laser processing etc. and has heat resistance so that the stopper 36 made from polyimide resin can be suitably used for burn-in test of the IC package 33. In addition polyimide resin has a high hardness so that the stopper 36 made of polyimide resin can effectively prevent the deformation of the solder ball 33a when used in the IC socket.

Further, an elastic member 34c having elasticity made from, for example, a rubber-like material, is disposed under the electrode pattern 35a of the tab film 35. The elastic member 34c can surely bring the solder ball 33a of the IC package 33 into electrical contact with the tab film 35 without excessive deformation of the solder ball 33a.

Further, positioning of the side portion of the solder ball 33a is carried out by inserting the solder ball 33a into the solder ball opening 36a of the stopper 36 so that the IC package 33 can be set at more precise position.

In the above mentioned embodiments, the bolt 41 and the nut 42 are used as "fixing means" for detachably fixing the base plate 34, the tab film 35 and the pressing jig 38 etc. But the present invention is not limited to such means. For example, an engaging piece can be formed with the pressing jig 38 in one body for detachably engaging with the base plate 34 in order to clamp and hold the tab film 35. An independent engaging member can also be used for clamping the base plate 34 and the pressing jig 38 together in order to detachably fix the base plate 34, the tab film 35 and the pressing jig 38 etc.

Further, the contact pin 45 is not limited to the above mentioned embodiment, and can be one that can establish an electrical contact with the connecting electrode 35b of the tab film 35 by abutting on the electrode 35b. For example, a probe pin or the like can instead be used. Still further, the flexible tab film 35 is used in the above mentioned embodiment as the "intermediate connector." But the present invention is not limited to such intermediate connector. For example, other plate-like sheets having somewhat stiffness can also be used. When the sheet having somewhat stiffness is used, the electrode of the intermediate connector can be structured to abut elastically on the contact pin by forming an elastic portion in the contact pin 45.

Further, in the above mentioned embodiment, the contact pin as a connecting member is formed by press working from an electrical conductive metal plate, but the present invention is not limited to this embodiment, a probe pin or a spring-like contact can be preferably used instead.

What is claimed is:

1. An IC socket for an electrical part comprising:
    a base;
    a connecting member attached to the base and capable of electrically connecting to a printed circuit board;
    an intermediate connector provided on the base for electrically connecting the connecting member and a terminal of the electrical part, the intermediate connector comprising:
        an electrode pattern, which electrically connects to the terminal a the electrical part, formed on a portion of one surface of the intermediate connector, the electrical part being mounted on the one surface,
        a connecting electrode, which electrically connects to the connecting member, formed on a place of another surface of the intermediate connector, the another surface being placed face to face with the connecting member, and
        a conductor electrically connecting the electrode pattern and the connecting electrode;
    a pressing mechanism, mounted on the intermediate connector, comprising a body having an opening portion at a central portion of the body through which the electrical part is inserted, and a cover member rotatably attached to an end portion of the body, the cover member having a pressing member to press the electrical part when the cover member is rotated toward the body; and
    a fixing mechanism detachably fixing the base, the intermediate connector and the body together so as to align the body, the connecting electrode and the connecting member in a vertical direction,
    wherein the connecting electrode is pushed vertically by the body so that the connecting electrode and the connecting member elastically abut with each other at the time the base, the intermediate connector and the body are fixed together by the fixing mechanism.

2. An IC socket for an electrical part according to claim 1, wherein the intermediate connector is formed to have a flexible sheet and the upper end portion of the connecting member is designed to protrude from an upper surface of the base, the IC socket further comprises an elastic member disposed between the body and the portion of the one surface of the intermediate connector,
    wherein the elastic member is elastically deformed so that the connecting electrode and the connecting member are pressed with each other to establish an elastic contact therebetween.

3. An IC socket for an electrical part according to claim 1, wherein the connecting member is made of electrical conductive metal.

4. An IC socket for an electrical part according to claim 3, wherein the connecting member has an elongated plate-like shape having a thickness and width.

5. An IC socket for an electrical part according to claim 4, wherein the connecting member has a wider portion at one of its end portion and a tip end portion of the wider portion is shaped round in the width direction.

6. An IC socket for an electrical part according to claim 1, further comprising an elastic member disposed between the intermediate connector and the pressing mechanism.

7. An IC socket for an electrical part according to claim 6, wherein the elastic member is made of rubber.

8. An IC socket for an electrical part according to claim 1, further comprising an alignment plate to be disposed in the pressing mechanism.

9. An IC socket for an electrical part according to claim 1, further comprising a stopper disposed between the pressing mechanism and the intermediate connector.

10. An IC socket for an electrical part according to claim 9, wherein the stopper is made from resin.

11. An IC socket comprising:
    a base;
    a contact pin arranged on the base to electrically contact a terminal of a electrical part;
    an intermediate connector comprising an electrode pattern, and a connecting electrode electrically connecting the contact pin to the electrode pattern, to thereby allow the terminal to be electrically connected to the electrode pattern via the contact pin;
    a body having an opening through which the electrical part is inserted, wherein the base, the intermediate connector and the body are vertically aligned together; and
    a cover member rotatably attached to the body so that rotation of the cover member toward the body causes the connecting electrode to be pushed vertically by the body so that the connecting electrode and the contact pin elastically abut with each other, and causes the electrical part having been inserted through the opening to be pressed, to thereby provide contact between the contact pin and the terminal of the electrical part.

12. An IC socket according to claim 11, further comprising:
    an elastic member which is elastically deformed so that the connecting electrode and the contact pin are pressed with each other to establish an elastic contact therebetween.

13. An IC socket according to claim 11, wherein the contact pin is made of electrical conductive metal.

14. An IC socket according to claim 13, wherein the contact pin has an elongated plate-like shape.

15. An IC socket according to claim 14, wherein the contact pin has a wider portion at an end of the contact pin, and a tip of the wider portion has a round shape in the width direction.

16. An IC socket according to claim 11, further comprising an elastic member disposed between the intermediate connector and the body.

17. An IC socket according to claim 16, wherein the elastic member is made of rubber.

18. An IC socket according to claim 11, further comprising an alignment plate to align the electrical part in the IC socket when the electrical part is inserted in the opening of the body.

19. An IC socket according to claim 11, further comprising a stopper to prevent the terminal of the electrical part from being deformed when the rotation of the cover member causes the electrical part to be pressed.

20. An IC socket comprising:
 a base;
 a contact pin arranged on the base to electrically contact a terminal of an electrical part;
 a connecting electrode electrically connecting the contact pin;
 a body having an opening through which the electrical part is inserted, wherein the base, the connecting electrode and the body are vertically aligned together; and
 a cover member rotatably attached to the body so that rotation of the cover member toward the body causes the connecting electrode to be pushed vertically so that the connecting electrode and the contact pin elastically abut with each other, and causes the electrical part having been inserted through the opening in the body to be pressed, to thereby provide electrical contact between the contact pin and the terminal of the electrical part.

* * * * *

UNITED STATES PATENT AND TRADEMARK OFFICE
CERTIFICATE OF CORRECTION

PATENT NO. : 6,872,083 B2 Page 1 of 1
DATED : March 29, 2005
INVENTOR(S) : Hokuto Kanesashi It is certified that error appears in the above-identified patent and that said Letters Patent is hereby corrected as shown below:

<u>Column 11,</u>
Line 37, replace "a" (first occurrence) with -- of --.

Signed and Sealed this

Eighteenth Day of October, 2005

JON W. DUDAS
*Director of the United States Patent and Trademark Office*